(12) United States Patent
Moon

(10) Patent No.: US 8,329,362 B2
(45) Date of Patent: Dec. 11, 2012

(54) EXTREME ULTRAVIOLET MASK

(75) Inventor: Jae In Moon, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 159 days.

(21) Appl. No.: 12/833,925

(22) Filed: Jul. 9, 2010

(65) Prior Publication Data

US 2011/0189592 A1 Aug. 4, 2011

(30) Foreign Application Priority Data

Feb. 1, 2010 (KR) .................. 10-2010-0009297

(51) Int. Cl.
*G03F 1/24* (2012.01)
(52) U.S. Cl. ............................................. 430/5
(58) Field of Classification Search ........................ 430/5
See application file for complete search history.

(56) References Cited

U.S. PATENT DOCUMENTS

| | | | |
|---|---|---|---|
| 3,686,028 A * | 8/1972 | O'Keeffe | 430/5 |
| 2002/0045106 A1* | 4/2002 | Baselmans et al. | 430/5 |
| 2004/0234870 A1* | 11/2004 | Aschke et al. | 430/5 |
| 2005/0185173 A1 | 8/2005 | Hau-Riege | |
| 2006/0281017 A1* | 12/2006 | Kim et al. | 430/5 |
| 2008/0318138 A1 | 12/2008 | Holfeld | |

FOREIGN PATENT DOCUMENTS

KR 100604938 B1 7/2006
KR 1020100042470 A 4/2010

OTHER PUBLICATIONS

Grant, Roger and Claire, Grant & Hackh's Chemical Dictionary, Fifth Edition, 1987, McGraw-Hill, Inc., pp. 261 and 487.*

* cited by examiner

*Primary Examiner* — Mark F Huff
*Assistant Examiner* — John S Ruggles

(57) ABSTRACT

An extreme ultraviolet (EUV) mask includes a quartz substrate including an absorption region and a reflection region, first and second multi-layered thin films formed on the quartz substrate, and a structure pattern disposed between the first and second multi-layered thin films.

11 Claims, 3 Drawing Sheets

EXTREME ULTRAVIOLET MASK

CROSS-REFERENCES TO RELATED APPLICATION

This application claims priority under 35 U.S.C. 119(a) to Korean application number 10-2010-0009297, filed on 1 Feb. 2010, in the Korean Patent Office, which is incorporated by reference in its entirety as if set forth in full.

BACKGROUND OF THE INVENTION

The present invention relates to an extreme ultraviolet (EUV) mask and a method of manufacturing the same and, more particularly, to an EUV mask capable of preventing a shadow effect and a method of manufacturing the same.

As the size of a semiconductor device is reduced more and more, various technologies are developed to manufacture the semiconductor device. Among the various technologies the largest change has occurred in an exposure technology. In particular, a conventional immersion technology reaches a limit in semiconductor devices below 40 nm, and thus an extreme ultraviolet (EUV) lithographic process is being developed.

An EUV exposure process uses a light source having a very narrow wavelength of 13.5 nm, different from the conventional exposure technology. Accordingly, the EUV exposure process is regarded as an essential technology in developing the semiconductor device below 40 nm. Since the EUV exposure process uses a light source having a very narrow wavelength of 13.5 nm as compared with the prior art, a reflection mask is used instead of a transmission mask.

SUMMARY

The embodiments of the present invention provide a technology of substantially preventing a shadow effect by forming a structure pattern between multi-layered thin films. According to this, it is not necessary to correct the shadow effect, and a mask fabrication time can be shortened. Furthermore, the embodiments of the present invention provide an EUV mask capable of improving the resolution and forming a pattern with improved critical dimension (CD) uniformity by substantially preventing the shadow effect, and a method of manufacturing the mask.

According to one aspect of an exemplary embodiment, an extreme ultraviolet (EUV) mask includes a quartz substrate including an absorption region and a reflection region, first multi-layered thin film and a second multi-layered thin film formed over the quartz substrate, and a structure pattern disposed between the first multi-layered thin film and the second multi-layered thin film.

Herein, the structure pattern breaks the periodicity of the multi-layered thin film structure which is a reflector to be used as an absorption region.

The first and second multi-layered thin films may be comprised of a molybdenum layer and a silicon layer. The first and second multi-layered thin films may have a stack structure that 40 to 60 layers of molybdenum and 40 to 60 layers of silicon are alternately stacked. The first and second multi-layered thin films have the most preferable structure to reduce the interference of light.

The structure pattern may be included in the absorption region. The structure pattern may preferably comprise the same material as the first and second multi-layered thin film or an insulating layer. The structure pattern may be disposed between the first multi-layered thin film and the second multi-layered thin film deposited. The structure pattern may be used as an assist feature.

According to another aspect of another exemplary embodiment, a method of manufacturing an extreme ultraviolet (EUV) mask, includes forming a first multi-layered thin film over a quartz substrate including an absorption region and a reflection region, forming a structure pattern over the first multi-layered thin film, and forming a second multi-layered thin film on the first multi-layered thin film.

Herein, the structure pattern breaks the periodicity of the multi-layered thin film structure which is a reflector to be used as an absorption region.

Etch of the first and second multi-layered thin films may be formed as a stack structure of a molybdenum layer and a silicon layer. The first and second multi-layered thin films have a stack structure including 40 to 60 layers of molybdenum and 40 to 60 layers of silicon that are alternately stacked. The first and second multi-layered thin films have the most preferable structure to reduce the interference of light.

The forming a structure pattern includes forming a structure layer over the first multi-layered thin film, forming a photoresist pattern over the structure layer in the absorption region, etching the structure layer by using the photoresist pattern as an etch mask to form the structure pattern, and removing the photoresist pattern.

The structure pattern comprises the same material as the first and second multi-layered thin films or an insulating layer. The structure pattern may be used as an assist feature which is not be patterned.

The structure pattern may be disposed between the first multi-layered thin film is first deposited and the second multi-layered thin film deposited. After forming a second multi-layered thin film, the method may perform a chemical mechanical polishing process.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Figure 1:
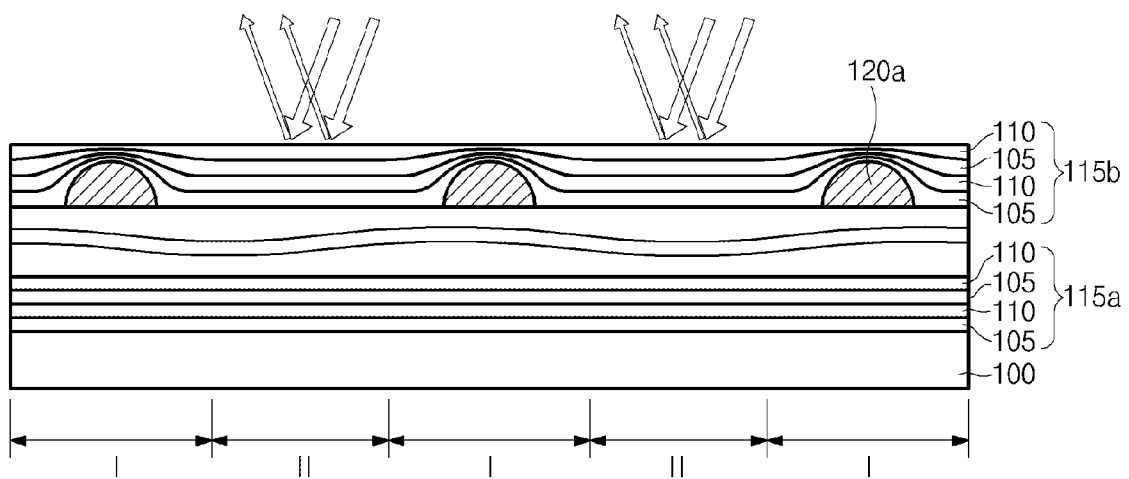
FIG. 1 is a sectional view of an EUV mask according to an embodiment of the present invention.

Embodiments of the present invention are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 1 is a sectional view of an extreme ultraviolet (EUV) mask according to an embodiment of the present invention. The EUV mask includes a quartz substrate 100 having an absorption region I and a reflection region II, a first multi-layered thin film 115a and a second multi-layered thin film 115b, wherein the first and second multi-layer thin films 115a and 115b are stacked on the quartz substrate 100.

Herein, each of the first and second multi-layered thin films 115a and 115b have a structure that a molybdenum layer 105 and a silicon layer 110 are sequentially stacked so as to reduce the interference of light. In accordance with this embodiment, the structure may include 40 to 60 molybdenum layers 105 and 40 to 60 silicon layers 110 that are alternately stacked to reduce the interference of light although only two molybdenum layers 105 and two silicon layers 110 are shown in FIG. 1.

The EUV mask further includes a structure pattern 120a disposed between the first multi-layered thin film 115a and the second multi-layered thin film 115b. The structure pattern 120a may be formed in any position between the first multi-layered thin film 115a and the second multi-layered thin film 115b.

Herein, a portion where the structure pattern 120a is formed serves as the absorption region I, and a portion where the structure pattern 120a is not formed serves as the reflection region II. Since the structure pattern 120a is used as an absorber, a pattern to be finally formed may have the same shape as the structure pattern 120a. At this time, the structure pattern 120a may be used as an assist feature.

If the structure pattern 120a is formed between the first multi-layered thin film 115a and the second multi-layered thin film 115b, the periodicity between multi-layered thin films sequentially stacked is broken. A portion where the periodicity is broken absorbs the light, and a portion where the periodicity is maintained reflects the light. Thus, a process for forming an absorption layer pattern on the multi-layered thin film can be omitted, so that the damage on the uppermost layer of the multi-layered thin film can be prevented when an etching process is carried out to form the absorption layer pattern.

Furthermore, a mask having a stereoscopic structure is formed due to the absorption layer pattern which is formed protruded from the multi-layered thin film in the prior art. However, the process for forming the absorption layer pattern is omitted to form a mask having a flat structure, so that an exposure process can be carried out without a shadow effect. The resolution in the exposure process and the CD uniformity can be improved due to the exposure process without the shadow effect. Herein, the EUV mask can be adapted to a binary mask or a phase shift mask, except for an EUV-only mask.

FIGS. 2A through 2D are sectional views illustrating a method of manufacturing the EUV mask in FIG. 1 according to an embodiment of the present invention.

Figure 2A:
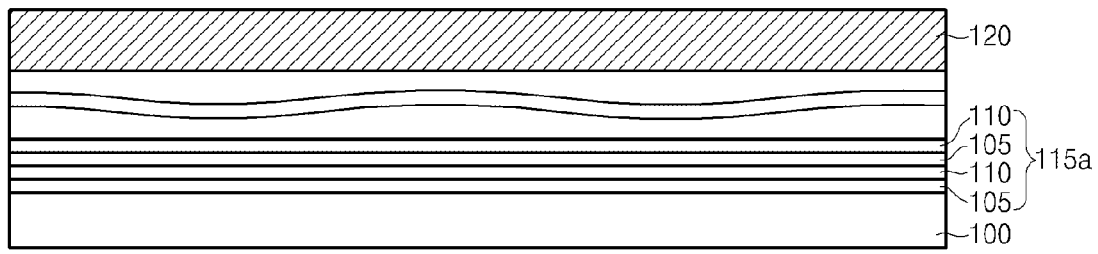
FIGS. 2A through 2D are sectional views of the EUV mask of FIG. 1 according to an embodiment of the present invention.

Referring to FIG. 2A, the first multi-layered thin film 115a is formed on the quartz substrate 100 including the absorption region I and the reflection region II. The first multi-layered thin film 115a has a stack structure where a plurality of molybdenum layers 105 and a plurality of silicon layers 110 are alternately stacked so as to reduce the interference of light. At this time, the multi-layered thin film 115a may have a stack structure where 40 to 60 molybdenum layers 105 and 40 to 60 silicon layers 110 are alternately stacked.

Next, a structure material layer 120 is formed on the first multi-layered thin film 115a. At this time, the structure material layer 120 may be comprised of the same material as that of the first multi-layered thin film 115a, or an insulating layer. For example, the structure material layer 120 may be formed of a molybdenum layer, a silicon layer or a combination thereof, or the structure material layer 120 may be formed of an insulating layer.

Figure 2B:
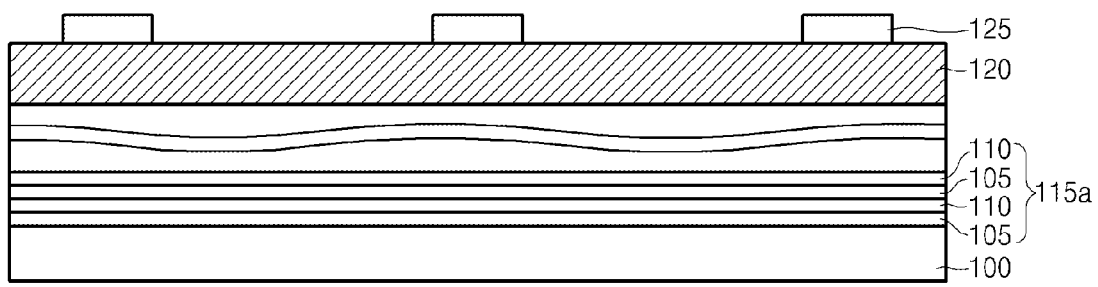

Next, referring to FIG. 2B, a photoresist pattern 125 is formed on the structure material layer 120. The photoresist pattern 125 may be formed on a portion of the structure material layer 120 which corresponds with the absorption region I.

Figure 2C:
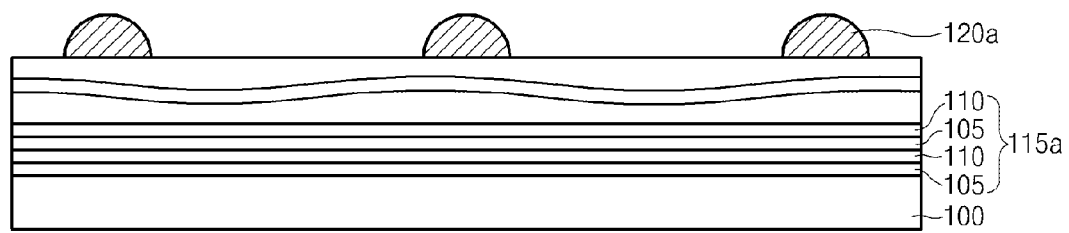

Referring to FIG. 2C, the structure material layer 120 is etched by using the photoresist pattern 125 as an etch mask to form the structure pattern 120a. Then, the photoresist pattern 125 is removed.

Figure 2D:
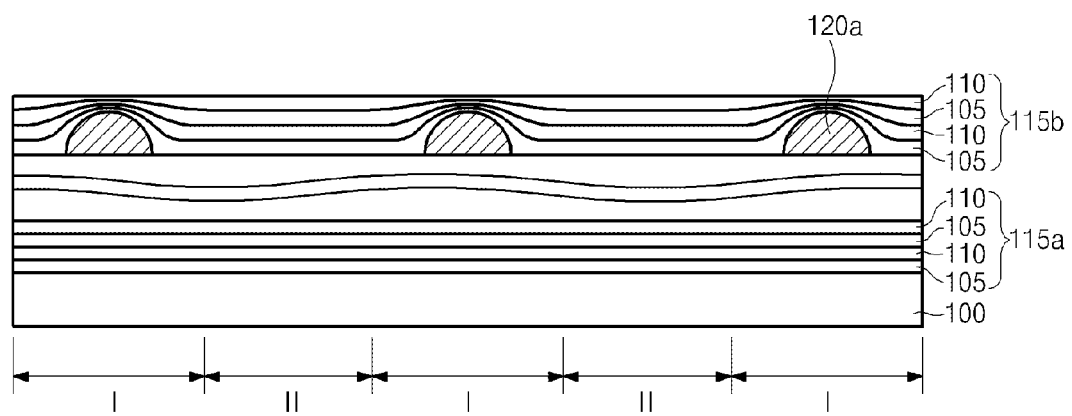

Referring to FIG. 2D, the second multi-layered thin film 115b is formed on the first multi-layered thin film 115a on which the structure pattern 120a is formed. The structure pattern 120a may be disposed between the first multi-layered thin film 115a and the second multi-layered thin film 115b. At this time, the structure pattern 120a may be formed in any position between the first multi-layered thin film 115a and the second multi-layered thin film 115b. Furthermore, after the second multi-layered thin film 115b is deposited, a chemical mechanical polishing (CMP) process is further carried out.

Herein, the portion that the structure pattern 120a is formed is used as the absorption region I and the portion that the structure pattern 120a is not formed is used as the reflection region II. That is, the structure pattern 120a is used as an absorber so that a pattern which is to be finally formed by an exposure process has the same shape as the structure pattern 120a. At this time, the structure pattern 120a may be used as an assist feature which is not to be patterned in the exposure process.

As described above, since the structure pattern 120a is formed between the first multi-layered thin film 115a and the second multi-layered thin film 115b to break the periodicity of the multi-layered thin films, the structure pattern 120a serves as an absorber. Because the periodicity of the multi-layered thin films is broken, the structure pattern 120a does not serve as a reflection layer, and thus it does not reflect but absorbs the light. This phenomenon has the same principle as a phenomenon where the defect is generated in a pattern shape if the defect is generated in a reflector. The light is absorbed in the portion where the periodicity is broken in the multi-layered thin films by the structure pattern 120a, and the light is reflected in the portion where the periodicity is maintained in the multi-layered thin films. According to this, a process of forming an absorption layer pattern on the multi-layered thin films can be omitted, so that it is possible to prevent the upper most layer of the multi-layered thin film from being damaged in an etching process for forming the absorption layer pattern.

Furthermore, in the prior art, the mask having the stereoscopic structure is formed due to the absorption layer pattern which is formed to protrude on the multi-layered thin film. However, in accordance with the embodiments of the present invention, the process for forming the absorption layer pattern can be omitted, so that the mask having the flat structure is formed by carrying out an exposure process without the shadow effect. The resolution in the exposure process and the CD uniformity of the pattern can be improved by the exposure process without the shadow effect.

Herein, the EUV mask can be adapted to a binary mask or a phase shift mask, except for an EUV-only mask.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. An extreme ultraviolet (EUV) mask, comprising:
   a quartz substrate;
   a reflection region including a multi-layered thin film disposed over the quartz substrate; and
   an absorption region including the multi-layered thin film and a structure pattern disposed in the multi-layered thin film,
   wherein the structure pattern is configured to break a periodicity of the multi-layered thin film in the absorption region to absorb light, so that a periodicity of the multi-layered thin film in the absorption region is different from a periodicity of the multi-layered thin film in the reflection region.

2. The EUV mask of claim 1, wherein the multi-layered thin film comprises a molybdenum layer and a silicon layer.

3. The EUV mask of claim 1, wherein the multi-layered thin film has a stack structure including 40 to 60 layers of molybdenum and 40 to 60 layers of silicon that are alternately stacked.

4. The EUV mask of claim 1, wherein a plurality of the multi-layered thin films are disposed over the quartz substrate.

5. The EUV mask of claim 1, wherein the structure pattern comprises a material that is the same as a material included in the multi-layered thin film.

6. The EUV mask of claim 1, wherein the structure pattern comprises an insulating layer.

7. The EUV mask of claim 1, wherein the structure pattern is disposed between a bottom of the multi-layered thin film and a top of the multi-layered thin film.

8. The EUV mask of claim 1, wherein the structure pattern is an assist feature.

9. The EUV mask of claim 1, wherein the multi-layered thin film in the absorption region and the reflection region has a planarized top surface so that the EUV mask has a flat structure.

10. The EUV mask of claim 9, wherein a chemical mechanical polishing process is performed on the multi-layered thin film to form the planarized top surface.

11. An extreme ultraviolet (EUV) mask, comprising:
    a quartz substrate;
    first and second multi-layered thin films sequentially disposed over the quartz substrate; and
    a structure pattern disposed between a top of the first multi-layered thin film and a bottom of the second multi-layered thin film over a portion of the quartz substrate,
    wherein the structure pattern and portions of the first and second multi-layered thin films corresponding to the structure pattern form an absorption region for absorbing light, and remaining portions of the first and second multi-layered thin films form a reflection region for reflecting the light, wherein the structure pattern is configured to break up a periodicity of the second multi-layered thin film in the absorption region to further absorb the light, and
    wherein the second multi-layered thin film has a planarized top surface so that the EUV mask has a flat structure.

* * * * *